United States Patent [19]

Bertellotti et al.

[11] 4,385,438

[45] May 31, 1983

[54] TOOL FOR EXTRACTING PRINTED CIRCUIT CARDS

[75] Inventors: Ansano Bertellotti, Addison; Arvo Taliste, Downers Grove, both of Ill.

[73] Assignee: GTE Automatic Electric Labs Inc., Northlake, Ill.

[21] Appl. No.: 274,901

[22] Filed: Jun. 18, 1981

[51] Int. Cl.³ .................................................. H05K 3/36
[52] U.S. Cl. .................................. 29/764; 29/267; 29/758; 294/15
[58] Field of Search .................. 29/764, 762, 747, 758, 29/267, 268, 278; 294/15

[56] References Cited

U.S. PATENT DOCUMENTS

| | | | |
|---|---|---|---|
| 2,691,506 | 10/1954 | Wilson | 29/267 X |
| 3,617,083 | 11/1971 | Koppensteiner et al. | 294/15 |
| 3,903,576 | 10/1974 | Stein | 29/764 |

Primary Examiner—Carl E. Hall
Attorney, Agent, or Firm—Robert J. Black; Anthony Miologos

[57] ABSTRACT

A tool for extracting a printed circuit card from a holder the latter having a top and bottom guide tracks and a rear wall having contacts engageable by terminal tabs on the card, comprising a pistol grip type handle and a shaft extending perpendicularly outward from the handle. The shaft includes a hook on one end and is mounted to the handle at an opposite end. A plunger including a stop bracket is slideably mounted on the shaft and is propelled forward via a spring loaded trigger bracket. The hook is applied to the rear of the circuit card handle and the stop bracket rested on the bottom guide track. When the trigger is squeezed the hook pulls and extracts the circuit card from the holder.

5 Claims, 2 Drawing Figures

TOOL FOR EXTRACTING PRINTED CIRCUIT CARDS

BACKGROUND OF THE INVENTION (1) Field of the Invention

The present invention relates to a tool designed to facilitate the extraction of a printed circuit card from a holder.

(2) Description of the Prior Art

Today, printed circuit cards are frequently assembled in a holder rack having the shape of an open topped box whose side walls form tracks for the guidance of cards sent to and out of their assembled position. Terminal tabs on a base strip or block of each board fit into a socket having co-acting contacts to complete a connection to an external circuit. In practice, the track forming side walls may be horizontally disposed, with the contact bearing sockets arranged on the upright rear wall.

The extraction of such printed circuit cards from their holder is a somewhat delicate operation since the abrupt reduction of frictional resistance upon disengagement of the connectors may lead to an accelerated withdrawal motion deviating from the straight linearity and thus impose bending stresses which could damage the printed circuits. This problem is perceptively increased as the printed circuit cards become larger which substantially increase the extraction force required.

Accordingly, a tool is usually required to properly extract these cards. The tool must be compact, simple to operate as well as human engineered to be comfortably operated by either hand. Many cards presently on the market have extraction mechanisms built on the printed circuit cards. This approach increases the individual card cost and therefore a separate tool is more economical approach to the card removal requirement.

It therefore becomes an object of the present invention to provide an improved tool of the character described which facilitates the extraction of such printed circuit cards.

SUMMARY OF THE INVENTION

The tool according to our invention comprises a pistol grip type handle including a shaft extending perpendicularly outward from the handle. The shaft terminates in a hooked or curved paw which is oriented in an upward direction. The plunger is slideably mounted via a central bore about the shaft and arranged to slide along the shaft. The plunger further includes a deviation and stop bracket which is arranged to rest against the holder bottom card guide. The assembly is completed by a spring loaded trigger bracket which when compressed by the operator's hand, transfers the manual force to the plunger pushing the plunger forward.

The tool has been designed to work with holders of the type having an open card cage construction. The holders should have at least top and bottom front card guides oriented in a horizontal direction. The card guides also include transverse slots which accept lateral edges of the printed circuit card which hold and guide the card to the connector found in the rear of the holder. With this in mind, the operation of the tool will be explained.

It should be noted that the tool is used with cards which include a handle on a front edge.

To withdraw a printed circuit card the tool is applied by grasping the tool in either hand, and while holding it in a downward angle inserting it into the holder area. The hook is then engaged behind the circuit card handle while simultaneously a front lip of the deviation and stop bracket is rested against a front edge of the bottom card guide. A free hand is placed on the top of the circuit card and the trigger is actuated allowing hook paw to pull the circuit card from the connector.

DESCRIPTION OF THE DRAWINGS

The above and other features of our invention will now be described in detail with reference to the accompanying drawings in which.

DESCRIPTION OF THE PREFERRED EMBODIMENT

Figure 1:
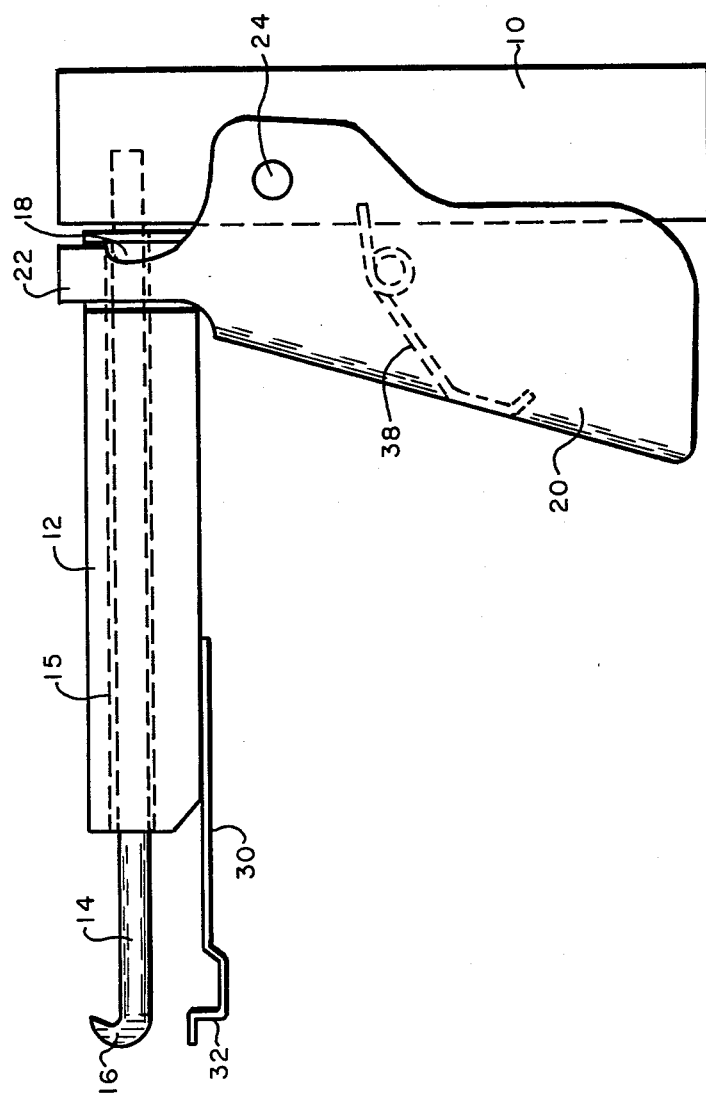
FIG. 1 is a side elevational view of the tool of the present invention.

Turning now to the included drawings FIG. 1 illustrates the tool of the present invention. The tool includes a rectangular handle 10 having a shaft 14 extending outward perpendicular to the handle from a top portion thereof. Shaft 14 terminates and is rigidly mounted at handle 10 on a rear end and at an upward oriented hook or paw 16 on an opposite end. A plunger 12 is slideably mounted over shaft 14 via a central bore 15. Plunger 12 further includes a notched recess 18 on a left side thereof and a deviation and stop bracket 30 which also includes a shoulder portion 32 mounted to the bottom side of plunger 12. The assembly is completed by a trigger bracket 20 which is pivotally mounted to the handle 10 via a pin 24. Trigger bracket 20 also includes an upper lever 22. Lever 22 is housed within notch 18. A spring 38 biases the trigger bracket 20 outward.

The tool is intended to be used in circuit card housings of the type which have at least top and bottom horizontal card guides found on the front of the housing. These card guides also include transverse slots which are arranged to receive opposite edges of the circuit card. The slots hold and guide the card to associated connectors which are vertically oriented at the back of the holder. Further, the cards may also include a handle on a front edge in order to be easier to grasp when extracting the circuit card from the holder.

With this in mind an explanation of the extraction of a circuit card employing the tool of the present invention will now be described in detail.

Figure 2:
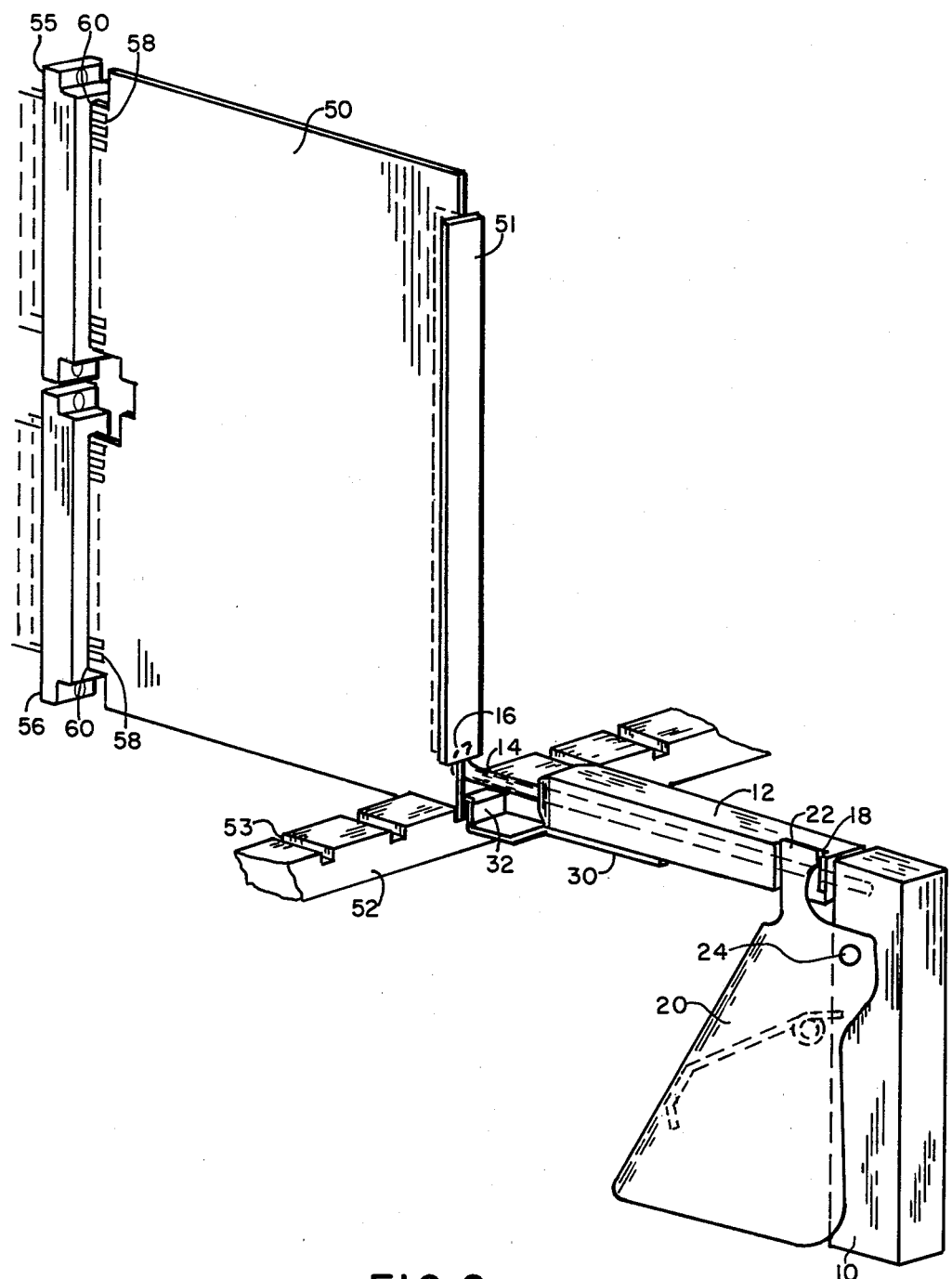
FIG. 2 is a perspective view of the tool of the present invention used to extract a circuit card.

Turning now to FIG. 2 it can be seen that a circuit card 50 is resting on a horizontal card guide 52 having transverse slot 53 which leads to a pair of connectors 55 and 56. Connectors 55, 56 each include a slot 60 arranged to accept a rear edge of the circuit card and engage card contact pads. The top card guide has been eliminated from the drawing as well as other card holder structures for ease of explanation.

To extract an installed circuit card the tool is grasped in either hand and the tool is applied by first holding it at a downward angle and inserting it to the holder area below the card handle 51 and card guide 52. The tool is then leveled with hook 16 engaged behind handle 51 and shoulder 32 of the stop bracket resting against a top edge of card guide 52. A free hand is placed at the top of card handle 51 and the trigger 20 squeezed. The force exerted by squeezing trigger 20 is transferred to plunger 12 via lever 22 and notch 18, which allows hook 16 to pull the circuit card out of connectors 55 and 56. Once cleared of the connectors circuit card 50 can be extracted by hand.

In this manner the card is removed from the holder without any damage to the card or connector. The tool of the present invention has advantages in ease of operation, portability and universal usage. It can also be appreciated by those skilled in the art that the tool may be used with cards of different sizes and shapes.

The present invention has been described with reference a specific embodiment thereof, for the purpose of illustrating the manner in which the invention may be used to advantage, and will be appreciated by those skilled in the art that the invention is not limited thereto. Accordingly, any and all modifications, variations or equivalent arrangements which may occur to those skilled in the art should be considered to be within the scope of the invention.

What is claimed is:

1. A manipulator for facilitating the extraction of a printed circuit card from a holder the latter having top and bottom parallel card guides, each card guide including at least one transversely oriented guide track having respective lateral card edges resting therein, said circuit card including, a handle mounted perpendicular to a transverse edge of said circuit card said manipulator comprising:

a first member having a shaft projecting outwardly perpendicular to said first member and said shaft terminating in a hooked end, said hooked end arranged to engage said circuit card handle;

plunger means slideably mounted to said shaft and moveable along said shaft including a retainer member extending outward from said plunger means and arranged to rest against said bottom card guide;

lever means rotatably mounted to said first member and including first and second sections said first section in communication with said plunger means and said second section disposed to have manual pressure applied thereto urging said second section toward said first member and said first section in response to said pressure moving said plunger away from said first member whereby said hook end applys a force to said circuit card handle and extracting said card from said holder.

2. A manipulator as defined in claim 1, wherein: said first member is comprised of a rectangular handle having a square cross section and having said shaft extending outwardly perpendicular from one face of the upper portion of the said handle and said shaft hooked end oriented upwardly.

3. A manipulator as defined in claim 1, wherein: said plunger is rectangularly shaped and includes a longitudinal bore running through said plunger arranged to accept said shaft therein allowing said plunger to be moveable along said shaft, said plunger further including a vertically oriented notch on one face thereof adjacent said handle arranged to accept said lever means first section therein.

4. A manipulator as defined in claim 1, wherein: said lever means second section is comprised of a triangularly shaped trigger said trigger rotatably mounted to opposite faces of said handle and having a verticle upstanding leg extending from said trigger forming said lever means first section, said trigger including a wire spring biasing said trigger away from said handle.

5. A manipulator as defined in claim 1, wherein: said retainer extends outward from a bottom face of said plunger parallel to said shaft and includes an L-shaped front section, said front section arranged to bear against said bottom card guide.

* * * * *